(12) United States Patent
Kugler

(10) Patent No.: US 8,946,685 B2
(45) Date of Patent: Feb. 3, 2015

(54) METHOD OF MAKING AN ORGANIC THIN FILM TRANSISTOR

(75) Inventor: Thomas Kugler, Milton (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 8 days.

(21) Appl. No.: 13/258,671

(22) PCT Filed: Apr. 13, 2010

(86) PCT No.: PCT/GB2010/000739
§ 371 (c)(1),
(2), (4) Date: Oct. 31, 2011

(87) PCT Pub. No.: WO2010/119243
PCT Pub. Date: Oct. 21, 2010

(65) Prior Publication Data
US 2012/0037915 A1    Feb. 16, 2012

(30) Foreign Application Priority Data
Apr. 16, 2009 (GB) .................................. 0906587.1

(51) Int. Cl.
*H01L 35/24* (2006.01)
*H01L 51/00* (2006.01)

(52) U.S. Cl.
CPC .................................. *H01L 51/0012* (2013.01)
USPC ........................... 257/40; 257/66; 257/51.001

(58) Field of Classification Search
CPC ........................ H01L 51/0012; H01L 51/0545
USPC ......... 257/40, E21.036, 66; 438/99, 478, 198
See application file for complete search history.

(56) References Cited

U.S. PATENT DOCUMENTS

| 2005/0029514 A1 | 2/2005 | Moriya |
| 2006/0113526 A1 | 6/2006 | Hanna et al. |

(Continued)

FOREIGN PATENT DOCUMENTS

| EP | 1 679 752 A1 | 7/2006 |
| EP | 1 684 360 A1 | 7/2006 |

(Continued)

OTHER PUBLICATIONS

Lipowsky et al., Wetting and dewetting of structured and imprinted surfaces, 2000, Colloids and Surfaces A: Physicochemical and Engineering Aspects, 161, 3-22.*

(Continued)

*Primary Examiner* — Anthony Ho
(74) *Attorney, Agent, or Firm* — Marshall, Gerstein & Borun LLP

(57) ABSTRACT

A method of forming an organic thin film transistor the method comprising:
 seeding a surface outside a channel region with one or more crystallization sites prior to deposition of the organic semiconductor;
 depositing a solution of the organic semiconductor onto the seeded surface and over the channel region whereby the organic semiconductor begins forming a crystal domain at the or each of the crystallization sites, the or each crystal domain growing from its crystallization site across the channel region in a direction determined by an advancing surface evaporation front; and
 applying energy to control the direction and rate of movement of the surface evaporation front thereby controlling the direction and rate of growth of the or each crystal domain across the channel region from the one or more crystallization sites outside the channel region.

10 Claims, 6 Drawing Sheets

(56) References Cited

U.S. PATENT DOCUMENTS

| | | | |
|---|---|---|---|
| 2006/0208266 A1 | 9/2006 | Yamamoto | |
| 2006/0289859 A1 | 12/2006 | Yoneya | |
| 2007/0012914 A1 | 1/2007 | Miura et al. | |
| 2007/0117298 A1* | 5/2007 | Fujimori et al. | 438/198 |
| 2007/0126003 A1 | 6/2007 | Ando et al. | |
| 2009/0206321 A1 | 8/2009 | Cha et al. | |

FOREIGN PATENT DOCUMENTS

| | | |
|---|---|---|
| JP | 2004-031458 A | 1/2004 |
| WO | WO-2007/064789 A2 | 6/2007 |

OTHER PUBLICATIONS

Becerril et al., "High-Performance Organic Thin-Film Transistors Through Solution-Sheared Deposition of Small-Molecule Organic Semiconductors," *Adv. Mater.*, 20(13):2588-2594 (2008).

Combined Search and Examination Report for Application No. GB0906587.1, dated Nov. 12, 2009.

International Preliminary Report on Patentability for Application No. PCT/GB2010/000739, dated Oct. 18, 2011.

International Search Report and Written Opinion for Application No. PCT/GB2010/000739, dated Aug. 18, 2010.

\* cited by examiner

METHOD OF MAKING AN ORGANIC THIN FILM TRANSISTOR

FIELD OF INVENTION

The present invention relates to organic thin film transistors and methods of making them.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and inject holes or electrons. For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO (Highest Occupied Molecular Orbital) level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO (Lowest Unoccupied Molecular Orbital) level of the semi-conductive material can enhance electron injection and acceptance.

Transistors can be formed by depositing the components in thin films to form thin film transistors. When an organic material is used as the semi-conductive material in such a device, it is known as an organic thin film transistor.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (channel between the source and drain electrodes). Thus, in order to achieve high drain currents with low operational voltages, organic thin film transistors must have an organic semiconductor which has highly mobile charge carriers in the channel region.

The application of organic thin film transistors is currently limited by the relatively low mobility of organic semiconductor materials. It has been found that one of the most effective means of improving mobility is to encourage the organic material to order and align. The highest mobility organic semiconductor materials in thin film transistors show substantial ordering and crystallization, which is evident from optical micrography and X-ray diffraction.

Techniques for enhancing crystallization of the organic semiconductor in an organic thin film transistor include: (i) thermal annealing of the organic thin film transistor after deposition of the organic semiconductor; and (ii) designing the organic semiconductor molecules such that the organic semiconductor inherently has an increased ability to crystallize after deposition.

There are some problems with the aforementioned methods of enhancing crystallization in organic thin film transistor devices. One problem with the thermal annealing technique is that the device must be heated. This can damage components of the device, increase energy costs for the manufacturer, and increase the processing time required to manufacture such devices. One problem with the molecular design route is that it is time consuming and expensive to design new molecules with increased ability to crystallize. Furthermore, modifying the molecular structure of the organic semiconductor can detrimentally affect the functional properties of the material in the resulting thin film transistor. Additionally, modifying the molecular structure of the organic semiconductor can detrimentally affect the processability of the material during manufacture of organic thin film transistors. For example, the solubility of the material can be affected such that the material becomes difficult to solution process using deposition techniques such as spin coating or ink jet printing.

Some further problems are common to both the aforementioned techniques. One problem is that both techniques result in an increase in crystallization throughout the organic semiconductor layer. It may not be desirable to increase the crystallinity, and thus the conductivity, of the organic semiconductor in certain regions of an organic thin film transistor as this may lead to current leakage and shorting problems between underlying and overlying metallization. As such, it would be advantageous to provide a method of increasing crystallisation of the organic semiconductor only in desired regions of an organic thin film transistor.

Furthermore, neither technique allows the orientation of the organic crystals to be readily controllable as the semiconductor crystallizes. This is important as the conductivity of an organic semiconductor is sensitive to the orientation of the organic crystals. If the organic crystals are aligned then the conductivity of the semiconductor will vary according to the direction of current flow relative to the orientation of the organic crystals.

It should be noted at this point that the orientation of maximum conductance is not necessarily parallel to the orientation of the organic crystals. Nor is it necessarily perpendicular to the orientation of the organic crystals. In fact, the direction of maximum conductance will depend on the structure of the organic molecules within the crystals. However, this is testable for a particular molecule by passing current through the material in various different angular directions and measuring the conductance. For certain materials there may even be several different crystal orientations at which a maximum conductivity is achieved with local minimum conductivity at angular orientations therebetween.

While not being bound by theory, conduction through an organic semiconductor material will occur via two mechanisms: (1) conductions along the organic molecules; and (2) inter-molecular hopping between molecules. Thus, if the dominant mechanism for conduction is along the organic molecules then the direction of maximum conductance will tend to be fairly well aligned with the molecular orientation. Alternatively, if the dominant mechanism for conduction is hopping between molecules then the direction of maximum conductance will tend to correspond to the direction in which it is easiest for charge to hop from one molecule to the next. This will often be in a more perpendicular direction to the molecular orientation due to better—orbital overlap between adjacent molecules in a sideways direction.

The contribution of the two mechanisms will depend on the molecular structure of the organic semiconductor. For example, if very long chain semiconductive polymers are utilized then conduction along the organic molecules may dominate. Thus, if the polymers have a chain length equivalent to, or longer than, the distance between the source and drain electrodes, then the direction of maximum conductance will tend to coincide with the polymers being aligned in a direction parallel to a line connecting the source and drain electrodes. However, if much shorter molecules are utilized then inter-molecular hopping will begin to dominate. In this instance, there may be little orbital overlap between "end-on" molecules and conductivity in the aligned direction may be low. Accordingly, it may be beneficial to orientate the crystals in a direction perpendicular to a line connecting the source and drain electrodes. However, this may lead to a large number of intermolecular hops being required for charge to pass between the source and drain. Accordingly, for molecules much shorter than the distance between source and drain electrodes, a crystal orientation inclined at an angle somewhere between perpendicular and parallel to a line connecting the source and drain electrodes will correspond to the orientation of maximum conductance.

A number of prior art documents disclose techniques for controlling the orientation of organic semiconductor molecules in the channel region of an organic thin film transistor. These are discussed below.

EP 1 684 360 A1 discloses that it is advantageous to control the orientation of organic semiconductor molecules such that a molecular axis of main chains thereof is oriented to be inclined with respect to a direction from the source to the drain electrode. In fabricating an organic thin film transistor having the aforementioned configuration, conjugated organic semiconductor molecules are dissolved in a predetermined solvent and the solution is applied on a substrate in which grooves are formed parallel to a desired orientation direction.

EP 1 679 752 A1 describes an arrangement in which the organic semiconductive layer of an organic thin film transistor is formed using a mixture of a semiconductive material and a liquid crystal material which is utilized to control the orientation of the semiconductive material. The direction of orientation is controlled by rubbing the surface on which the aforementioned mixture is to be deposited in a predetermined direction such as direction from source to drain electrode.

US 2007/0126003 describes that a self-assembled monolayer film may be used to control the orientation of organic semiconductor disposed thereon in a channel region of an organic thin film transistor. It is described that the organic semiconductor molecules are regularly orientated in crystal grains. It is further described that the organic semiconductive molecules disposed on the self-assembled monolayer film in the channel region have larger grains and have a higher orientation order than those in portions outside the channel region where no self-assembled monolayer film is provided.

US 2007/0117298 A1 discloses a method of manufacturing an organic thin film transistor using chemical seeding. It is described that a lyophobic material can be deposited around a channel region to contain an inkjet printed organic semiconductor deposited thereafter within the channel region. It is further described that a lyophobic pattern in the channel region can be provided in order to control crystallisation and molecular orientation of the organic semiconductor film.

US 2007/0012914 A1 discloses an organic thin film transistor in which a layer promoting crystallization is provided in a channel region with the organic semiconductor deposited thereon. It is disclosed that the organic semiconductor layer contains at least porphyrin having an organic silane structure and the crystallization promoting layer comprises at least a polysiloxane compound. The crystallization promoting layer is described as being a uniform film thickness. It is stated that crystallization is promoted by virtue of the effect of combination of the siloxane structure and the organic silane structure. It is further disclosed that each of the layers may be deposited from solution. The organic semiconductor may be deposited in a precursor form and heated in order to form the crystallized organic semiconductive layer. It is stated that the step of heating will play an important role in allowing the crystallization promoting functionality.

US 2006/0289859 A1 discloses an organic thin film transistor in which crystallization of the organic semiconductor is improved by providing a gate insulating layer comprising a mixture of an insulating polymer and a surface treating agent. The insulating polymer and the surface treating agent are deposited from solution as a mixture. Octadecytrichlorosilane is given as an example of the surface treating agent and polyvinyl phenol is given as an example of an insulating polymer. A cross-linking agent is also included in the mixture such that when the solution is deposited and dried, the components cross link.

US 2006/0208266 A1 discloses an organic thin film transistor in which a buffer layer is provided in the channel region prior to deposition of the organic semiconductor. The buffer layer is described as functioning to determine the orientation of the overlying organic semiconductor. The buffer layer is described as being made of an organic polymer material having a liquid crystal core. Prior to depositing the buffer layer, the surface is prepared by rubbing such that the molecules of the buffer layer are orientated in a specific direction prior to deposition of the organic semiconductor thereover. It is described that the buffer layer may be formed by preparing a solution of precursor materials, depositing these materials from solution and then polymerizing the materials to form the buffer layer.

US 2006/01135326 A1 discloses an organic thin film transistor comprising a liquid crystalline organic semiconductor material. A liquid crystal alignment layer is provided prior to deposition of the organic semiconductor material. It is described that the liquid crystal alignment layer may be one of: a layer prepared by coating a polyimide based material and then subjecting it to a rubbing treatment; a layer comprising a curing resin having minute unevenness; or a layer comprising a curing resin having minute unevenness wherein the crystal alignment layer and the base material are integrated.

US 2005/0029514 A1 discloses an organic thin film transistor in which a plurality of grooves are used to align an overlying organic semiconductor in the channel region.

In light of the above disclosures, it is evident that a large amount of work has been performed by many different groups with the aim of improving the crystalline arrangement of organic semiconductor material in an organic thin film transistor. However, none of the techniques are wholly successful in eradicating the need for charge hopping between crystal domains of the organic semiconductor material within a channel region of an organic thin film transistor. This is because all of the techniques result in crystal growth being initiated at a plurality of different points within the channel region. As a result, a plurality of crystal domains grow within the channel region, none of which stretch over the entire distance from the source to the drain electrode. Accordingly, any charge flowing between the source and drain will inevitably hit a crystal domain boundary and will be required to hop to an adjacent crystal domain to continue on its journey. Such crystal domain boundaries increase resistance to flow of current within the organic semiconductor resulting in lower charge mobility and lower conductance.

It is an aim of embodiments of the present invention to address the aforementioned problems.

SUMMARY OF INVENTION

According to a first aspect of the present invention, there is provided a method of forming an organic thin film transistor.

In particular, the method of forming a thin film transistor comprising source and drain electrodes with a channel region therebetween, a gate electrode, a dielectric layer disposed between the source and drain electrodes and the gate electrode, and an organic semiconductor disposed in at least the channel region between the source and drain electrodes, said method comprising: seeding a surface outside the channel region with one or more sites for initiating crystallization (crystallization sites) prior to deposition of the organic semiconductor; depositing a solution of the organic semiconductor onto the seeded surface and over the channel region whereby the organic semiconductor begins forming a crystal domain at the or each of the crystallization sites, the or each crystal domain growing from its crystallization site across the channel region in a direction determined by an advancing surface evaporation front; and applying energy to control the direction and rate of movement of the surface evaporation front thereby controlling the direction and rate of growth of the or each crystal domain across the channel region from the one or more crystallization sites outside the channel region.

Controlling the direction and rate of movement of the surface evaporation front may be achieved by flowing the solution of organic semiconductor over the crystallization sites and the channel region whereby the crystals grow in the direction of flow of the solution. For example, spin coating could be used as a method of deposition with the crystal domains growing in the tangential flow direction of the solution during spin coating. One disadvantage of this approach is that the resulting crystal domains will be curved requiring a corresponding alignment of the source and drain electrodes. Accordingly, a linear flow may be preferred in many applications.

As an alternative to the provision of a flowing solution of organic semiconductor, controlling the direction and rate of movement of the surface evaporation front may be achieved by applying a doctor blade over the or each crystallization site, the doctor blade being moved over the channel region whereby the crystals are forced to grow in the direction of movement of the doctor blade. A similar effect can be achieved using an air knife in place of the doctor blade. The air knife or doctor blade may be heated.

Another possibility is to control the direction and rate of movement of the surface evaporation front by applying a temperature gradient to the or each crystallization site and the channel region whereby the or each crystal domain grows in a direction determined by the temperature gradient. For example, a substrate on which the organic thin film transistor is being formed may be heated in different areas to different temperatures. Alternatively, the ambient temperature over the or each crystallization site and the channel region may be controlled so as to impart a temperature gradient.

Yet another alternative is to use a technique known as solution-shearing deposition. In this technique, a shearing force is applied to the solution by applying a shearing substrate on top of the deposited solution of organic semiconductor and dragging the shearing substrate in the direction desired for crystal growth. Preferably, the channel region has a surface which is wetting and the shearing substrate has a surface which is de-wetting.

Embodiments of the present invention provide techniques for enhancing the crystal structure of the organic semiconductor material in the channel region by ensuring the growth of a crystal domain is initiated at a fixed location outside the channel region and then progresses in a desired direction across the channel region such that crystal domains in the channel region extend over the entire length of the channel. With this arrangement it is possible for charge to flow between the source and drain without hitting a crystal boundary and avoid the requirement of charge hopping between crystal domains. Such an arrangement thus increases charge mobility and conductance between the source and drain electrodes.

In addition, the technique increases control of the crystal orientation of the organic semiconductor without requiring a modification in the molecular structure of the organic semiconductor material, thus avoiding the time and expense involved in designing new molecules. Furthermore, detrimental effects in the functional and processing properties of the organic semiconductor material, which may occur due to a modification in the molecular structure of the organic semiconductor, are avoided. For example, a known organic semiconductor can be selected for its functional and processing properties, and the present technique can then be used in order to increase the crystallinity of the material when it is deposited in the channel region of an organic thin film transistor.

Further still, embodiments of the present invention provide a method of increasing crystallization of the organic semiconductor only in the desired region of an organic thin film transistor, for example in the channel region and over the source and drain electrodes. As stated previously, it may not be desirable to increase the crystallinity, and thus the conductivity, of the organic semiconductor in all regions of a device as this may lead to current leakage at the sides of the device and shorting problems between underlying and overlying metallization. By using the present seeding and controlling technique, an increase in crystal orientation can be localized over the source and drain electrodes and in the channel region, such that the organic semiconductor has a higher conductivity in this region relative to other regions of the device. Accordingly, current leakage and shorting problems can be reduced.

According to certain embodiments, the one or more crystallization sites are provided on either a source electrode side or a drain electrode side of the channel region, or both. The one or more crystallization sites may be provided over, or indeed on, either of the source and drain electrode. The or each crystal domain may extend across the entire length of the channel region between the source and drain electrodes. For example, the crystal domains may be elongate in shape and extend in a direction parallel to a line connecting the source and drain electrodes.

However, it should be noted that the direction of maximum conductance within a crystal domain does not necessarily coincide with the elongate axis of the crystal domain for the reasons discussed previously in the background section. Conduction within a crystal domain will still involve both conduction along molecules and inter-molecular hopping between molecules. Thus, using the present invention it is also possible to orientate a crystal domain such that an axis of maximum conductance for the crystal domain is substantially parallel to an imaginary line directly connecting the source and drain electrodes (i.e. in the direction of flow of current between source and drain electrodes during operation). Preferably the axis of maximum conductance is aligned in a direction plus or minus 20° of the line connecting the source and drain electrodes, more preferably plus or minus 10°, more preferably still plus or minus 5°.

The axis of maximum conductance for a crystal domain can readily be found for a particular organic material by passing current through a crystal domain in various different angular directions and measuring the conductance. For certain materials there may even be several different orientations at which a maximum conductivity is achieved with local minima at angular orientations therebetween. In this case, one of the axes of maximum conductance is orientated in a direction substantially parallel to a line passing directly between the source and drain electrodes.

A plurality of crystallization sites may be provided, one for each of a plurality of crystal domains. Alternatively, only a single crystallization site may be provided. However, the single crystallization site may be elongate and extend adjacent to a side of the channel region such that a plurality of crystal domains can grow from different points along the single crystallization site.

The crystallization sites may comprise one or more physical structures. For example, the physical structure(s) may comprise one or more indentations in the surface onto which the organic semiconductor is deposited. The indentations may be formed, for example, by pressing a stamp into the surface. The surface may be pre-treated with a material which can then be stamped in order to form the indentations. Alternatively, the physical structures may be provided by forming a raised pattern on the surface onto which the organic semiconductor is deposited. For example, a patterned layer may be transferred from a stamp.

The physical structure may be a groove or ridge extending along a side of the channel region, for example over or adjacent the source or drain electrode.

As an alternative to seeding the surface in the channel with physical structures, the surface can be seeded using a chemical approach. Crystallization sites may be formed by localized wetting or de-wetting domains. Localized de-wetting domains at source and drain sides of the channel region may be particularly advantageous as they can act to contain the organic semiconductor within an active region of the device and also act as crystallization start and stop points for the crystal domains.

According to one arrangement, the organic thin film transistor is a bottom-gate organic thin film transistor and the method comprises: forming the gate electrode on the substrate; forming the dielectric layer over the gate electrode; forming the source and drain electrodes over the dielectric layer, the source and drain electrodes being spaced apart with the channel region therebetween located over the gate electrode; seeding the surface outside the channel region with the one or more crystallization sites; depositing the solution of the organic semiconductor onto the seeded surface and over the channel region; and controlling the direction and rate of movement of the surface evaporation front thereby controlling the direction and rate of growth of the or each crystal domain across the channel region from the one or more crystallization sites outside the channel region.

According to an alternative arrangement, the organic thin film transistor is a top-gate organic thin film transistor and the method comprises: forming the source and drain electrodes over the substrate, the source and drain electrodes being spaced apart with the channel region therebetween; seeding the surface outside the channel region with one or more crystallization sites; depositing the solution of the organic semiconductor onto the seeded surface and over the channel region; controlling the direction and rate of movement of the surface evaporation front thereby controlling the direction and rate of growth of the or each crystal domain across the channel region from the one or more crystallization sites outside the channel region; forming the dielectric layer over the organic semiconductor; and depositing the gate electrode over the dielectric layer.

According to another aspect of the present invention, there is provided an organic thin film transistor as specified in claims 1 to 6. Preferably formed according to the previously described method, the organic thin film transistor comprises source and drain electrodes with a channel region therebetween, a gate electrode, a dielectric layer disposed between the source and drain electrodes and the gate electrode, wherein a surface outside the channel region comprises one or more crystallization sites and an organic semiconductor is disposed over the one or more crystallization sites and the channel region between the source and drain electrodes, the organic semiconductor comprising one or more crystal domains which extend from the one or more crystallization sites over the channel region. Each crystal domain may consist of a single crystal or a plurality of crystals in alignment.

BRIEF DESCRIPTION OF THE DRAWINGS

The present invention will now be described in further detail, by way of example only, with reference to the accompanying drawings in which.

DETAILED DESCRIPTION OF THE PREFERRED EMBODIMENTS

Figure 1:
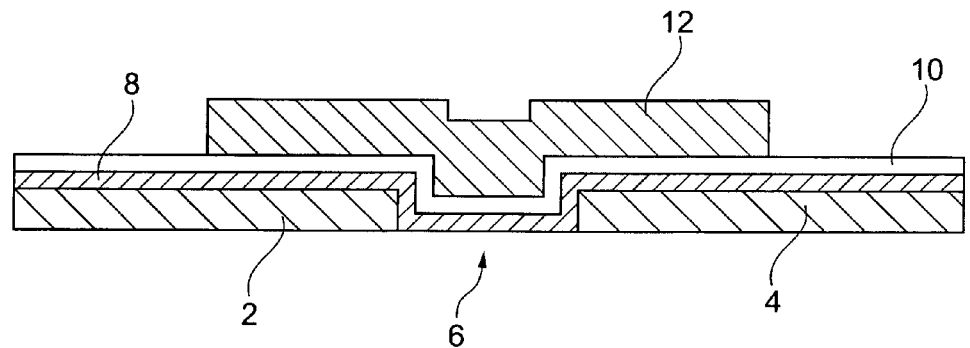
FIG. 1 shows a top-gate organic thin film transistor structure according to a prior art arrangement.
Figure 2:
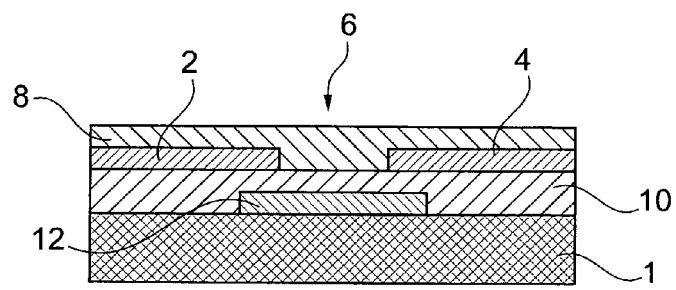
FIG. 2 shows a bottom-gate organic thin film transistor structure according to a prior art arrangement.
Figure 3:
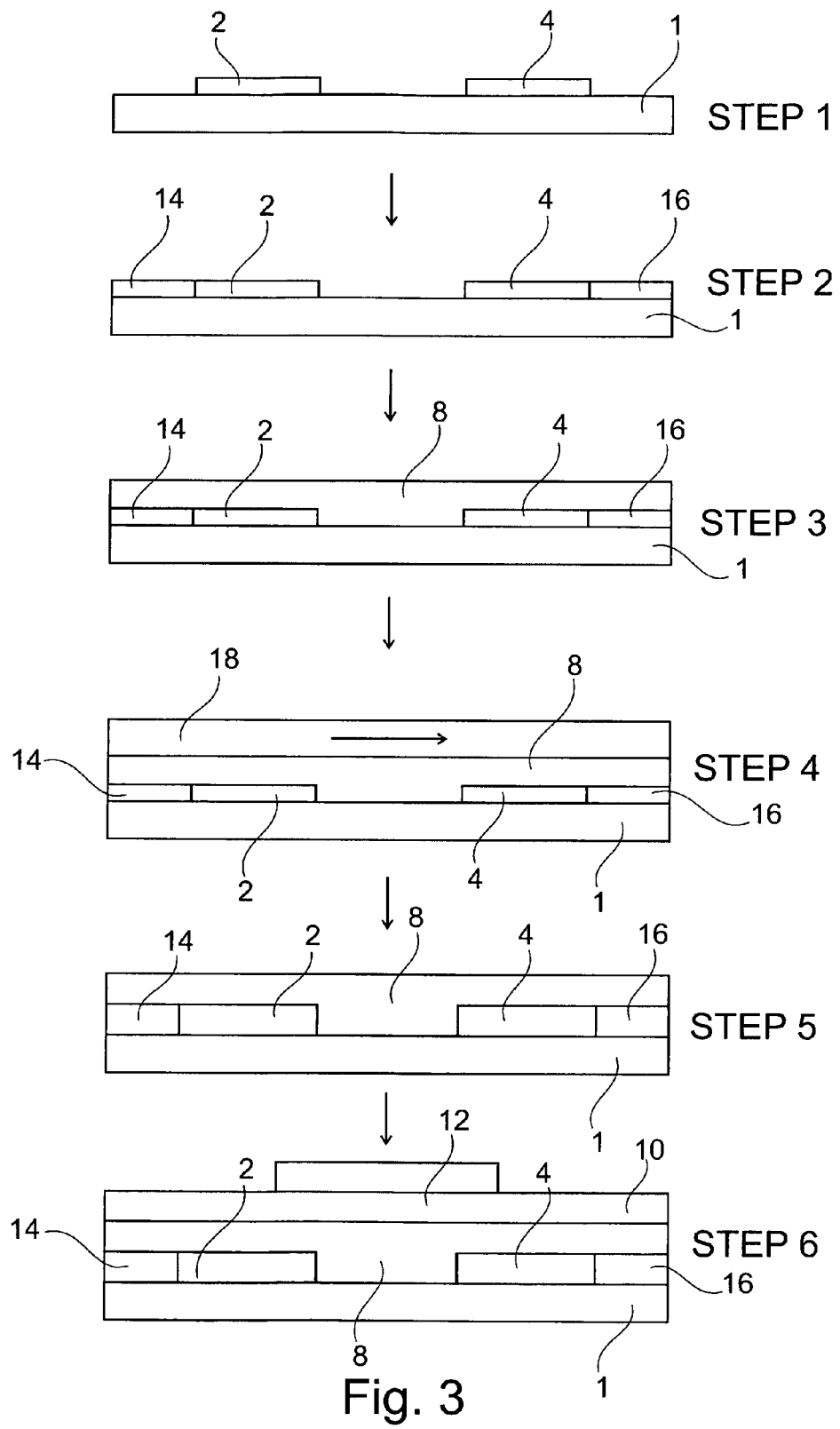
FIG. 3 illustrates the method steps involved in forming an organic thin film transistor according to an embodiment of the present invention.

An example method of how the present technique may be carried out is shown schematically in FIG. 3.

In step 1, a substrate 1 is initially prepared by formation of source and drain electrodes 2, 4 thereon.

In step 2, crystallization sites 14, 16 are formed on the substrate 1 adjacent the source and drain electrodes 2, 4. The crystallization sites 14, 16 may comprise a de-wetting material such as Teflon™.

In step 3, a solution of an organic semiconductor 8 is deposited. The organic semi-conductive material may be solution processable such that it can be deposited from solution by, for example, ink-jet printing. The organic semi-conductive material may comprise a small molecule organic semi-conductor, a polymer or a dendrimer. Many such semi-conductive materials are known in the art.

In step 4, while the solution of organic semiconductor 8 is still wet, a shearing substrate 18 is placed on the solution and dragged in a source-to-drain direction as indicated by the arrow in the Figure. This causes crystal domains to grow from the crystallization site 14 to the crystallization site 16 forming the structure illustrated in step 5.

Finally, the device is completed in step 6 by depositing a dielectric layer 10, and a gate electrode 12 thereon (this is a top gate transistor architecture).

The electrodes can be printed or deposited using other simple patterning techniques which are known in the art.

The dielectric material may be solution processable. For example, the dielectric layer may be an organic photoresist such as a polyimide which can be readily spin coated and patterned. Alternatively, the dielectric layer may be an inorganic material such as $SiO_2$.

An organic semiconductor with a tendency to order and crystallize is preferred. An organic semiconductor formulation containing a high boiling point solvent is also preferred, as this provides a longer time-frame for the molecules to rearrange while the crystal domains are growing. For example, the a solvent having a boiling point in the range 100° C. to 200° C. is preferred, more preferably between 150° C. and 200° C., most preferably around 175° C. This will depend on the type of deposition method used.

The concentration of the solution is preferably in the range 0.5% to 5%, more preferably 1% to 2%, most preferably around 2%. A concentration of about 2% is preferred for spin coating OSC solutions. Other deposition techniques may require slightly higher or lower concentrations.

The drying temperature is also controlled to ensure that the solution of organic semiconductor remains in its fluid state for sufficient time for the crystal domains to grow. The drying temperature may be in the range 25° C. to 100° C., more preferably 25° C. to 50° C., and most preferably around 25° C. This will depend on the solvent system being used.

In order to create an advancing drying front that results in oriented crystal growth, the drying rate is advantageously equal to the flow rate/shearing rate of the organic semiconductor solution. Preferably, the drying time is in the range 10 seconds to 10 minutes, more preferably 20 seconds to 5 minutes, more preferably 40 seconds to 4 minutes. Typically coating times in the range of several tens of seconds to a few minutes are used for an active matrix backplane substrate.

In step 4, molecules dissolved in solution begin to crystallize at the nucleation site 14. This embodiment makes use of boundaries between surface patterns with largely differing wetting properties as preferred nucleation sites for locally inducing crystallization of an organic semiconductor deposited from solution. Fast de-wetting occurs from the de-wetting regions. This effect, in combination with the application of a shearing force, results in a thinning of the organic semiconductor solution at the boundary of the de-wetting regions. This results in a local acceleration of the drying process and the localized formation of seeding crystals (nucleation) at the de-wetting boundary. Evaporation of the solvent results in a build-up of a concentration gradient with the organic semiconductor concentration being highest at the wettability boundary and decreasing in a direction of the shearing force. As a consequence, crystal growth occurs from the seeding crystals initially formed at the de-wetting boundary and proceeds in a direction of the applied shearing force. The initial seeding crystals may be ribbon-like. However, with increasing distance from the de-wetting boundary these OSC crystal ribbons merge into a single crystal domain. By creating wettability boundaries at a suitable distance and orientation to the source and drain electrodes of the transistor, large, single-crystalline organic semiconductor crystals can be generated that bridge the transistor channel.

Accordingly, by defining preferred nucleation sites the invention allows controlling where the crystallization starts, i.e. the exact location where the resulting crystals originate from.

Furthermore, in addition to defining the location of the crystal origins, the application of a shearing force results in an orientation effect, whereby the crystals grow in parallel to the shearing force direction.

Finally, in addition to defining the location of the crystal origins and the orientation of the crystals, the invention allows controlling the sizes/dimensions of the crystals as a function of: (1) the area sizes and shapes of the wetting and de-wetting areas which define the boundary where preferred nucleation occurs; (2) the boiling point of the solvent and concentration of the solution of organic semiconductor; and (3) the magnitude of the applied shearing force.

The invention can be applied to the fabrication of organic thin film transistors in order to control: (1) the location/origin of crystals of small-molecule organic semiconductors such as TIPS pentacene (6,13-bis(triisopropyl-silylethynyl) pentacene); (2) the size and dimension of the resulting organic semiconductor crystals; and (3) the orientation of the resulting organic semiconductor crystals relative to the source and drain electrodes in organic thin film transistors.

As the charge carrier mobility in small-molecule organic semiconductor films is critically dependent on the crystal morphology, embodiments allow an increase in mobility for a given organic semiconductor material, and improved reproducibility, i.e. reduce the scattering of the mobility values obtained for organic thin film transistor devices with a given channel length.

Figure 4:
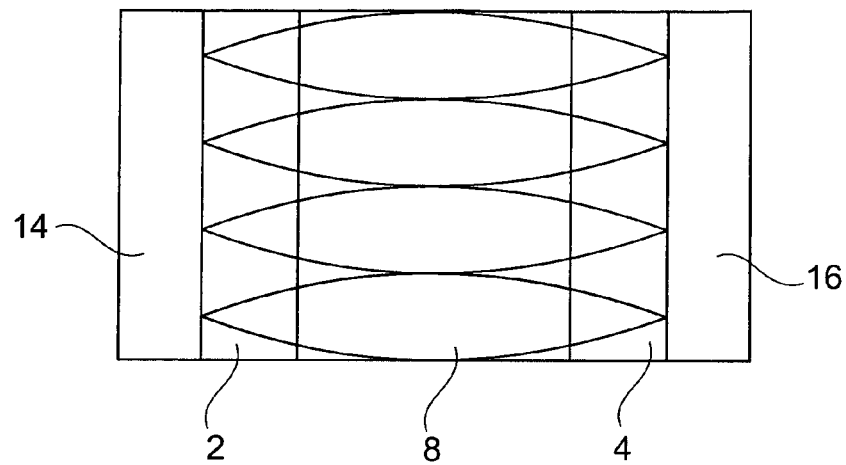
FIG. 4 shows a plan view of an intermediate product in the method of FIG. 3.

FIG. 4 shows a plan view of the intermediate product shown in step 5 of FIG. 3. Crystal domains of the organic semiconductor 8 extend over the channel region between the source and drain electrodes 2, 4 from the de-wetting region 14 to the de-wetting region 16.

Figure 5:
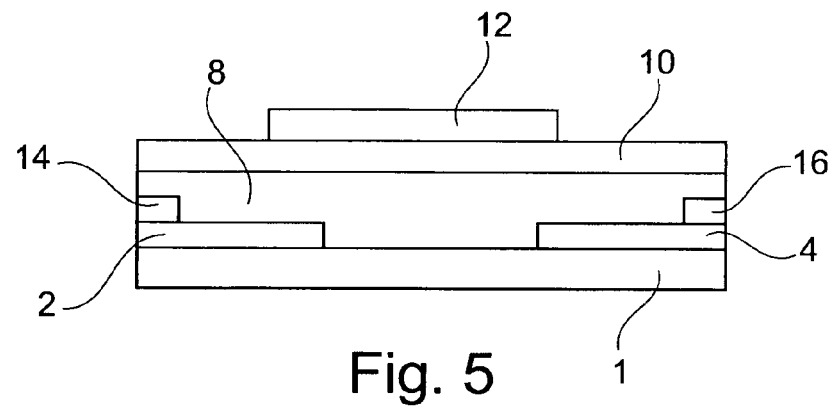
FIG. 5 illustrates an organic thin film transistor according to another embodiment of the present invention.

FIG. 5 shows a slightly modified version of the arrangement shown in step 6 of FIG. 3. In the arrangement illustrated in FIG. 5, the crystallization sites 14, 16 are formed on the source and drain electrodes 2, 4 rather than on the substrate 1 adjacent the source and drain electrodes 2, 4.

Figure 6:
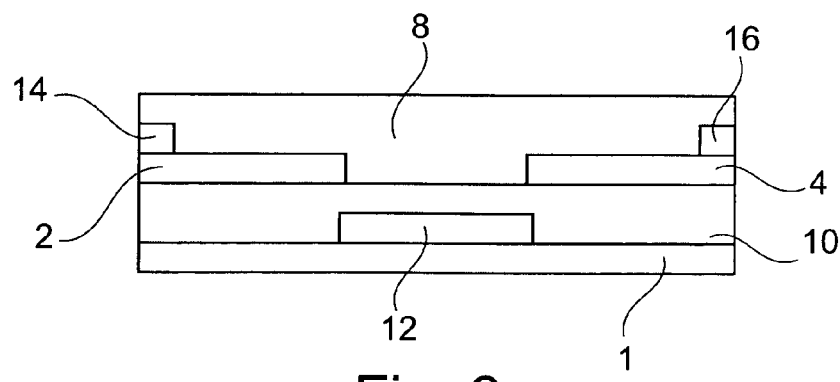
FIG. 6 illustrates an organic thin film transistor according to another embodiment of the present invention.

FIG. 5 illustrates a top-gate organic thin film transistor. In contrast, FIG. 6 illustrates a bottom-gate organic thin film transistor. In this case, the gate electrode 12 is formed on the substrate 1, the dielectric layer 10 is formed over the gate electrode and the source and drain electrodes 2, 4 are formed over the dielectric layer 10. The source and drain electrodes 2, 4 are spaced apart with the channel region therebetween located over the gate electrode 12. Nucleation sites 14, 16 are formed over the source and drain electrodes 2, 4 and a solution of organic semiconductor 8 is deposited over the channel region and nucleation sites, a shearing force being then applied during drying as previously described.

Figure 7:
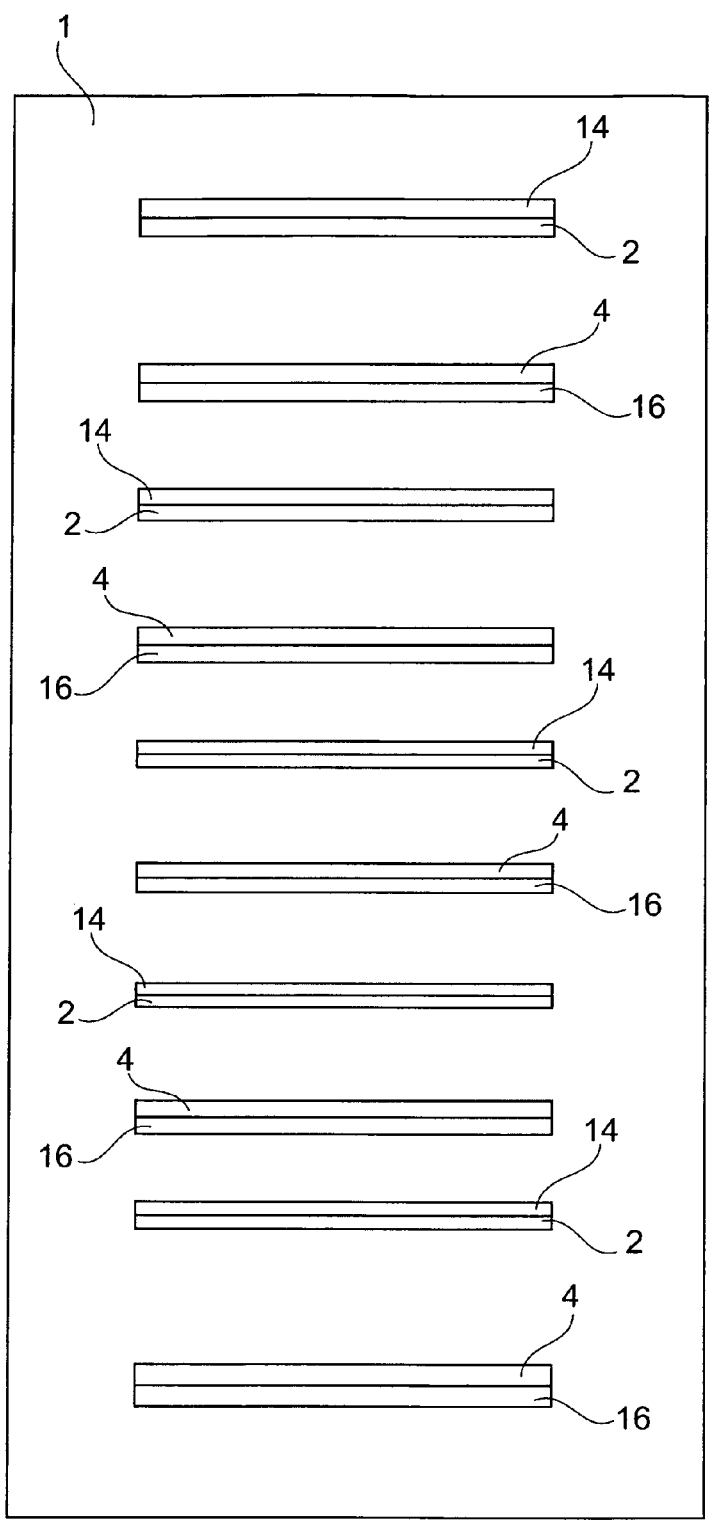
FIGS. 7 to 9 show plan views of successive intermediate products according to another embodiment of the present invention.
Figure 8:
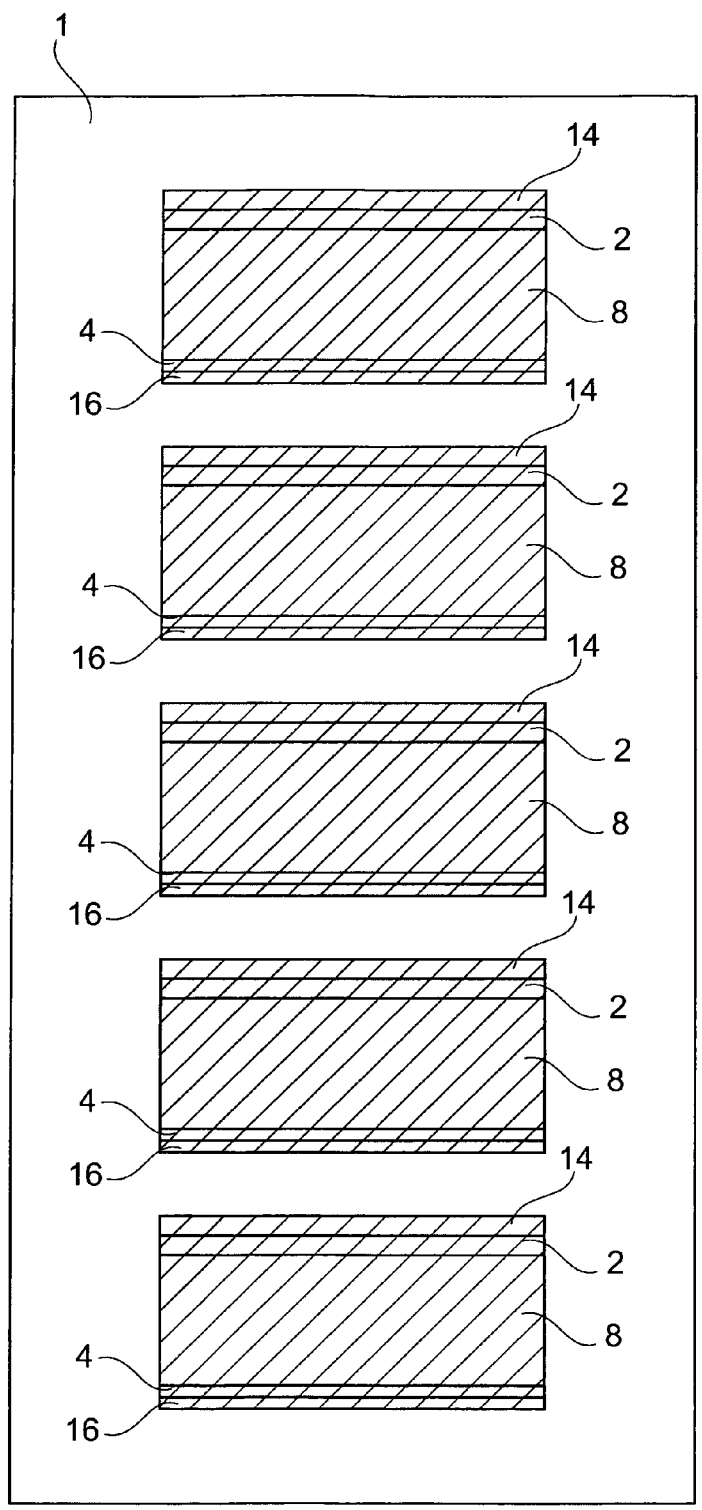
Figure 9:
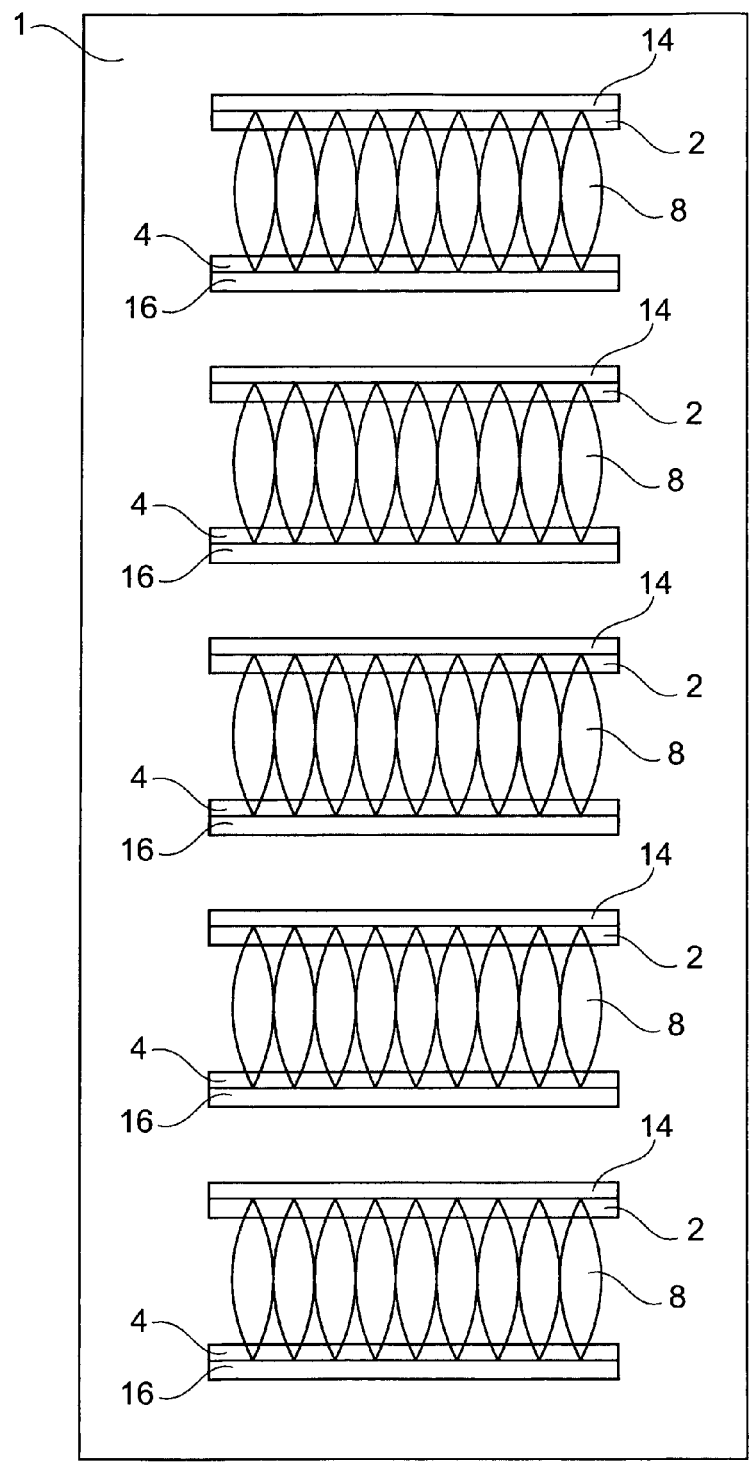

FIGS. 7 to 9 show plan views of successive intermediate products according to a method in which multiple organic thin film transistors are formed together on a common substrate 1. Source and drain electrodes 2, 4 are deposited on the substrate along with crystallization sites 14, 16 as illustrated in FIG. 7. In FIG. 7, five sets of opposing source and drain electrodes 2, 4 are provided for five organic thin film transistor devices.

A solution of organic semiconductor is then deposited between each pair of source-drain electrodes as illustrated in FIG. 8. If de-wetting material is used for the crystallization sites 14, 16 then this aids in containing the solution of semiconductor material in the desired regions.

A shearing substrate is then placed over the substrate 1 so as to contact the organic semiconductor solution in each of the device areas. The shearing substrate is dragged in a source-to-drain direction forming the crystal domain structure illustrated in FIG. 9.

Each of the devices can then be completed by depositing a dielectric layer and a gate electrode. The five transistors may then be separated by scoring and breaking the substrate between the devices.

Further features of organic thin film transistors (OTFTs) according to embodiments of the present invention are discussed below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Solution deposition techniques include spin coating and ink jet printing. Other solution deposition techniques include spray coating, dip-coating, roll printing and screen printing.

Organic Semiconductor Materials

Organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Examples of p-Type organic semiconductor materials include: soluble derivative of pentacene such as 6,13-bis(triisopropyl-silylethynyl) pentacene (TIPS-pentacene); and soluble derivatives of anthradithiophene such as fluorinated 5,11-bis(triethylsilylethynyl) anthradithiophene (diF-TESADT). More generically: soluble derivatives of acenes such as tetracene, chrysene, pentacene, pyrene, perylene, coronene, benzodithiophene, anthradithiophene, and other condensed aromatic and hetero-aromatic hydrocarbons; soluble derivatives of copper phthalocyanine, lutetium bisphthalocyanine, or other porphyrins and phthalocyanine compound metal complexes; and soluble, suitably substituted, oligomers (tetramers-hexamers) of the following conjugated hydrocarbon and heterocyclic polymers: polyaniline, polythiophenes, polypyrrole, polyfuran, polypyridine, polythienylene vinylene.

Examples of n-Type organic semiconductor materials include: soluble methanofullerene [60] such as [6,6]-phenyl-C61-butyric acid ester ([60]PCBM); soluble methanofullerene [70] such as [6,6]-phenyl-C71-butyric acid methyl ester ([70]PCBM); soluble derivatives of naphthalene di dicarboxyanhydrides and naphthalene dicarboximides; and soluble derivatives of dicyanoperylene-3,4:9,10-bis(dicarboximides).

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, silver or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimization of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Insulating Layer

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include $SiO_2$, $SiN_x$ and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. Other examples include fluorinated polymers in fluorinated solvents. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometers, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, eg octadecyltrichlorosilane. Similarly, the source and drain electrodes may be provided with a SAM to improve the contact between the organic semiconductor and the electrodes. For example, gold SD electrodes may be provided with a SAM comprising a thiol binding group and a group for improving the contact which may be a group having a high dipole moment; a dopant; or a conjugated moiety.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. An organic thin film transistor comprising:
source and drain electrodes with a channel region therebetween;
a gate electrode;
a dielectric layer disposed between the source and drain electrodes and the gate electrode; and
an organic semiconductor layer,
wherein a surface outside the channel region comprises one or more sites for initiating crystallization and the organic semiconductor layer is disposed over the one or more sites and the channel region between the source and drain electrodes, the organic semiconductor layer comprising one or more crystal domains which extend from the one or more crystallization sites across the entire length of the channel region between and over the source and drain electrodes.

2. An organic thin film transistor according to claim 1, wherein the one or more sites for initiating crystallization are provided on either a source electrode side or a drain electrode side of the channel region, or both.

3. An organic thin film transistor according to claim 2, wherein the one or more sites for initiating crystallization are provided over, or adjacent to, the source electrode, the drain electrode, or both source and drain electrodes.

4. An organic thin film transistor according to claim 1, wherein the one or more sites for initiating crystallization are provided by a boundary of a de-wetting material, the de-wetting material being de-wetting relative to a surface of the channel region.

5. An organic thin film transistor according to claim 1, wherein the or each crystal domain has an axis of maximum conductance aligned in a direction plus or minus 20° of an imaginary line perpendicular to both the source and drain electrodes.

6. An organic thin film transistor according to claim 1, wherein the or each crystal domain consists of a single crystal.

7. An organic light-emissive device comprising an organic thin film transistor according to claim 1.

8. An organic thin film transistor comprising:
source and drain electrodes with a channel region therebetween;

a gate electrode;

a dielectric layer disposed between the source and drain electrodes and the gate electrode; and an organic semiconductor layer, wherein a surface outside the channel region comprises one or more sites for initiating crystallization and the organic semiconductor layer is disposed over the one or more crystallization sites and the channel region between the source and drain electrodes, the organic semiconductor layer comprising one or more crystal domains which extend from the one or more crystallization sites across the entire length of the channel region between and over the source and drain electrodes, wherein the organic semiconductor layer is disposed at least in part over the source and/or drain electrodes.

9. An organic thin film transistor according to claim 8, wherein the organic thin film transistor is a top-gate transistor.

10. An organic thin film transistor according to claim 8, wherein the one or more crystallization sites are formed on the source and/or drain electrodes.

* * * * *